US011028482B2

(12) United States Patent
Durbin et al.

(10) Patent No.: US 11,028,482 B2
(45) Date of Patent: Jun. 8, 2021

(54) USE OF VOLTAGE AND CURRENT MEASUREMENTS TO CONTROL DUAL ZONE CERAMIC PEDESTALS

(71) Applicant: LAM RESEARCH CORPORATION, Fremont, CA (US)

(72) Inventors: Aaron Durbin, Portland, OR (US); Ramesh Chandrasekharan, Portland, OR (US); Dirk Rudolph, Dundee, OR (US); Thomas G. Jewell, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/859,619

(22) Filed: Apr. 27, 2020

(65) Prior Publication Data

US 2020/0255945 A1 Aug. 13, 2020

Related U.S. Application Data

(62) Division of application No. 15/972,850, filed on May 7, 2018, now Pat. No. 10,633,742.

(51) Int. Cl.
*C23C 16/52* (2006.01)
*H05B 1/02* (2006.01)
(Continued)

(52) U.S. Cl.
CPC ........ *C23C 16/52* (2013.01); *C23C 16/45525* (2013.01); *C23C 16/46* (2013.01); *H05B 1/0233* (2013.01); *H05B 3/265* (2013.01)

(58) Field of Classification Search
CPC ... C23C 16/52; C23C 16/45525; C23C 16/46; C23C 16/4586; H05B 1/0233; H05B 3/265
See application file for complete search history.

(56) References Cited

U.S. PATENT DOCUMENTS

| 5,280,422 A | 1/1994 | Moe et al. |
| 5,521,850 A | 5/1996 | Moe et al. |

(Continued)

FOREIGN PATENT DOCUMENTS

| JP | H07153550 A | 6/1995 |
| JP | H10116885 A | 5/1998 |

(Continued)

OTHER PUBLICATIONS

U.S. Appl. No. 62/694,171, filed Jul. 5, 2018, in the names of Sairam Sundaram et al.; & entitled "Dynamic Temperature Control of Substrate Support in Substrate Processing System", pp. 1-14. (Year 2018).

(Continued)

*Primary Examiner* — Yuechuan Yu

(57) ABSTRACT

A method for controlling temperature of a substrate support includes receiving first and second currents corresponding to first and second heater elements, respectively, of a substrate support, receiving first and second voltages corresponding to the first and second heater elements, respectively, calculating a first resistance of the first heater element based on the first voltage and the first current, calculating a second resistance of the second heater element based on the second voltage and the second current, calculating a first temperature of a first zone of the substrate support based on the first resistance and stored data correlating resistances to temperatures, calculating a second temperature of a second zone of the substrate support based on the second resistance and the stored data, and selectively adjusting the stored data based on a comparison between a sensed temperature and at least one of the calculated first temperature and second temperature.

13 Claims, 4 Drawing Sheets

(51) Int. Cl.
*C23C 16/455* (2006.01)
*C23C 16/46* (2006.01)
*H05B 3/26* (2006.01)

(56) References Cited

U.S. PATENT DOCUMENTS

| | | |
|---|---|---|
| 6,627,859 B1 | 9/2003 | Kasai et al. |
| 6,951,587 B1 | 10/2005 | Narushima |
| 7,196,295 B2 | 3/2007 | Fennewald et al. |
| 8,552,346 B2 | 10/2013 | Ambal et al. |
| 8,772,682 B2 | 7/2014 | Ambal et al. |
| 9,123,755 B2 | 9/2015 | Swanson et al. |
| 2005/0028736 A1 | 2/2005 | Long |
| 2005/0258160 A1 | 11/2005 | Goto et al. |
| 2007/0218200 A1 | 9/2007 | Suzuki et al. |
| 2012/0118225 A1 | 5/2012 | Hsu et al. |
| 2013/0180963 A1 | 7/2013 | Zhang et al. |
| 2013/0270252 A1 | 10/2013 | Ambal et al. |
| 2014/0083361 A1 | 3/2014 | Rocha-Alvarez et al. |
| 2016/0079039 A1 | 3/2016 | Dhindsa et al. |
| 2016/0379851 A1 | 12/2016 | Swaminathan et al. |
| 2017/0215230 A1 | 7/2017 | Parkhe |
| 2017/0236733 A1 | 8/2017 | Leeser |
| 2017/0280509 A1 | 9/2017 | Takebayashi |
| 2017/0363663 A1 | 12/2017 | Breitlow et al. |
| 2017/0372928 A1 | 12/2017 | Yamada et al. |
| 2018/0090306 A1 | 3/2018 | Higashijima et al. |
| 2018/0190529 A1 | 7/2018 | Takebayashi et al. |
| 2018/0348265 A1 | 12/2018 | Hopkins-Breitlow et al. |

FOREIGN PATENT DOCUMENTS

| | | |
|---|---|---|
| JP | 2000235886 A | 8/2000 |
| JP | 2000339039 A | 12/2000 |
| JP | 5567318 B2 | 8/2014 |
| JP | 2017076691 A | 4/2017 |
| JP | 2017228230 A | 12/2017 |
| KR | 20-2009-0003703 U | 4/2009 |
| KR | 10-2017-0088352 A | 8/2017 |
| KR | 10-2018-0035151 A | 4/2018 |
| WO | WO-2018016384 A1 | 1/2018 |

OTHER PUBLICATIONS

International Search Report and Written Opinion corresponding to PCT/US2019/030366 dated Aug. 13, 2019, 13 pages.
International Search Report and Written Opinion corresponding to PCT/US2019/045093 dated Novoember 15, 2019, 14 pages.
International Search Report and Written Opinion corresponding to PCT/US2019/045097 dated Dec. 20, 2019, 11 pages.
International Search Report and Written Opinion corresponding to PCT/US2019/040416 dated Oct. 23, 2019, 12 pages.
International Search Report and Written Opinion corresponding to PCT/US2018/061542 dated Mar. 8, 2019, 10 pages.

USE OF VOLTAGE AND CURRENT MEASUREMENTS TO CONTROL DUAL ZONE CERAMIC PEDESTALS

CROSS-REFERENCE TO RELATED APPLICATIONS

The present disclosure is a divisional of U.S. patent application Ser. No. 15/972,850 filed on May 7, 2018. The entire disclosure of the application referenced above is incorporated herein by reference.

FIELD

The present disclosure relates to a temperature tunable pedestal for an ALD substrate processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Examples of substrate treatments include etching, deposition, photoresist removal, etc. During processing, the substrate is arranged on a substrate support such as an electrostatic chuck and one or more process gases may be introduced into the processing chamber.

The one or more processing gases may be delivered by a gas delivery system to the processing chamber. In some systems, the gas delivery system includes a manifold connected by one or more conduits to a showerhead that is located in the processing chamber. In some examples, processes use atomic layer deposition (ALD) to deposit a thin film on a substrate.

SUMMARY

A controller for a substrate processing system includes a resistance calculation module configured to receive a first current and a second current corresponding to a first heater element and a second heater element, respectively, of a substrate support, receive a first voltage and a second voltage corresponding to the first heater element and the second heater element, respectively, calculate a first resistance of the first heater element based on the first voltage and the first current, and calculate a second resistance of the second heater element based on the second voltage and the second current. A temperature control module is configured to separately control power provided to the first heater element and the second heater element based on the first resistance and the second resistance, respectively, and respective relationships between the first resistance and a first temperature of a first zone of the substrate support and the second resistance and a second temperature of a second zone of the substrate support.

In other features, the resistance calculation module is further configured to calculate a first power associated with the first heater element based on the first voltage and the first current and calculate a second power associated with the second heater element based on the second voltage and the second current. A temperature calculation module is configured to calculate a first temperature of a first zone of the substrate support based on the first resistance and calculate a second temperature of a second zone of the substrate support based on the second resistance. To control the power based on the first resistance and the second resistance, the temperature control module is configured to control the power provided to the first heater element and the second heater element based on the first temperature and the second temperature, respectively.

In other features, the temperature calculation module is further configured to calculate the first temperature and the second temperature based on a thermal coefficient of resistance of a material of the first heater element and the second heater element. The material has a thermal coefficient of resistance of at least 1.0%. The temperature calculation module stores data correlating resistances of the material with respective temperatures of the material, and wherein the temperature calculation module is configured to calculate the first temperature and the second temperature further based on the stored data. The stored data includes a conversion table. The temperature calculation module is configured to calculate a correction factor based on differences between a plurality of measured temperatures of at least one of the first zone and the second zone and a plurality of calculated temperatures of the first zone and the second zone and modify an output of the conversion table based on the correction factor.

In other features, the temperature calculation module is configured to calculate the first temperature and the second temperature during an atomic layer deposition process. The temperature control module is further configured to, in response to a change in a thermal load in the first zone causing a change in the first resistance, adjust the power provided to the first heater element. The temperature control module is further configured to adjust the power provided to the first heater element and the second heater element such that the first temperature and the second temperature are different. A substrate processing system includes the controller and the substrate support and the controller is further configured to control an atomic layer deposition process performed on a substrate arranged on the substrate support.

A method for controlling temperature of a substrate support in a substrate processing system includes receiving a first current and a second current corresponding to a first heater element and a second heater element, respectively, of a substrate support, receiving a first voltage and a second voltage corresponding to the first heater element and the second heater element, respectively, calculating a first resistance of the first heater element based on the first voltage and the first current, calculating a second resistance of the second heater element based on the second voltage and the second current, and separately controlling power provided to the first heater element and the second heater element based on the first resistance and the second resistance, respectively, and respective relationships between the first resistance and a first temperature of a first zone of the substrate support and the second resistance and a second temperature of a second zone of the substrate support.

In other features, the method includes calculating a first power associated with the first heater element based on the first voltage and the first current and calculating a second power associated with the second heater element based on the second voltage and the second current. The method includes calculating a first temperature of a first zone of the substrate support based on the first resistance and calculating a second temperature of a second zone of the substrate support based on the second resistance. Controlling the power based on the first resistance and the second resistance includes controlling the power provided to the first heater element and the second heater element based on the first temperature and the second temperature, respectively.

In other features, the method includes calculating the first temperature and the second temperature based on a thermal coefficient of resistance of a material of the first heater element and the second heater element. The material has a thermal coefficient of resistance of at least 1.0%. The method includes storing data correlating resistances of the material with respective temperatures of the material and calculating the first temperature and the second temperature further based on the stored data. The method includes calculating a correction factor based on differences between a plurality of measured temperatures of at least one of the first zone and the second zone and a plurality of calculated temperatures of the first zone and the second zone and modifying an output of a conversion table based on the correction factor.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
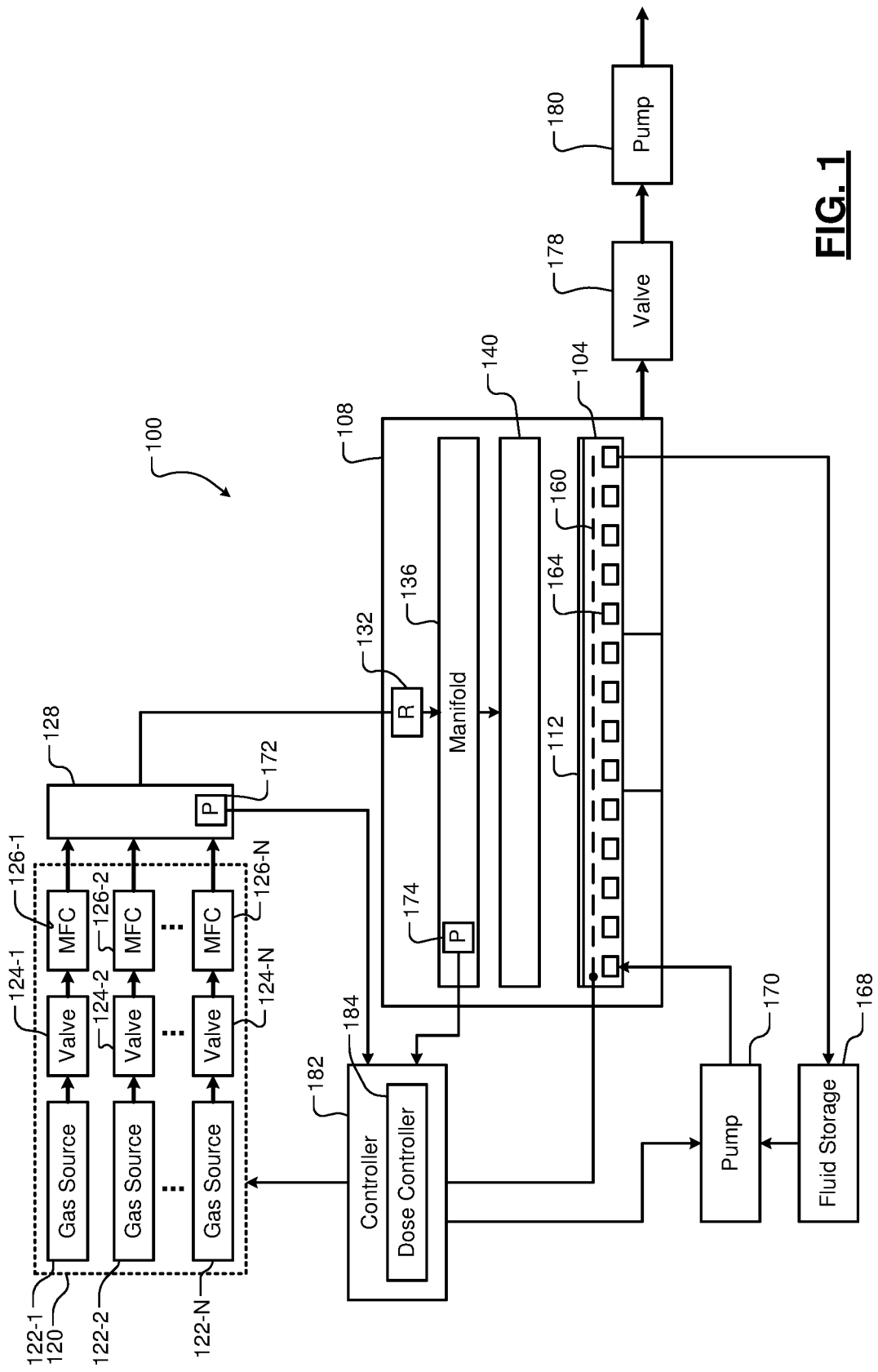
FIG. 1 is a functional block diagram of an example of a substrate processing system according to the present disclosure.

In film deposition processes such as atomic layer deposition (ALD), various properties of the deposited film vary across a spatial (i.e., x-y coordinates of a horizontal plane) distribution. For example, substrate processing tools may have respective specifications for film thickness non-uniformity (NU), which may be measured as a full-range, a half-range, and/or a standard deviation of a measurement set taken at predetermined locations on a surface of a semiconductor substrate. In some examples, the NU may be reduced either by, for example, addressing a direct cause of the NU and/or introducing a counteracting NU to compensate and cancel the existing NU. In other examples, material may be intentionally deposited and/or removed non-uniformly to compensate for known non-uniformities at other (e.g. previous or subsequent) steps in a process. In these examples, a predetermined non-uniform deposition/removal profile may be calculated and used.

Various properties of deposited ALD films may be influenced by a temperature of the substrate during deposition. Accordingly, a substrate support (e.g., a pedestal such as an ALD pedestal) may implement a temperature control system. For example, during an ALD process (e.g., deposition of an oxide film), a substrate is arranged on the pedestal. Typically, an ALD pedestal comprises a single temperature-controlled zone. In some examples, an ALD pedestal may include multiple temperature-controlled zones (e.g., a center, inner zone and an outer zone). A heater layer may be embedded within an upper layer of the ALD pedestal. The heater layer may be configured to receive a voltage/current and function as a resistive heather to heat the pedestal and the substrate arranged thereon. The heater layer may be configured to heat a single zone or to separately heat multiple zones of the pedestal, such as an inner zone and an outer zone.

Typically, a pedestal including a single zone or multiple zones may include only a single temperature sensor arranged in a central region of the pedestal due to manufacturing and architecture constraints. Accordingly, accurate control of the temperature of the pedestal is limited. In other words, even in pedestals implementing separate temperature control for inner and outer zones, accurate control of the outer zone is limited due to uncertainty of the actual temperature of the outer zone. For example, due to component and process variations, a temperature of the pedestal (and, therefore, the substrate) in an outer zone is not equivalent to a temperature of the pedestal in the inner zone as indicated by the sensor arranged in the center region. Variations between the temperature in the inner zone and the outer zone (i.e., temperature non-uniformities) may cause substrate processing non-uniformities and, in extreme cases, damage to the substrate and/or components of the pedestal.

Systems and methods according to the principles of the present disclosure are configured to determine and control a temperature of the outer zone of a pedestal independently of the inner zone without a separate temperature sensor. For example, a pedestal according to the present disclosure may include a heater layer including heater elements having a high coefficient of thermal resistance (e.g., greater than or equal to 1.0%. For example the heater elements may include, but are not limited to, molybdenum and nickel heater elements. The material used for the heater elements has an associated temperature coefficient of resistance (TCR), which corresponds to an increased resistance (for positive TCR materials) or a decreased resistance (for negative TCR materials) as temperature increases. Accordingly, an overall resistance of the heater layer is indicative of the temperature of the heater layer. A current provided to the heater layer and a voltage across the heater layer may be measured to calculate the resistance of the heater layer. Respective temperatures of the outer zone and the inner zone may be calculated based on changes in the resistance of the heater layer. In this manner, temperatures of different zones of the substrate support (and, therefore, of regions of the substrate in the different zones) may be controlled independently of one another and independent of thermal load and other system transients as described below in more detail.

Referring now to FIG. 1, an example of a substrate processing system 100 including a substrate support (e.g., an ALD pedestal) 104 according to the present disclosure is shown. The substrate support 104 is arranged within a processing chamber 108. A substrate 112 is arranged on the substrate support 104 during processing.

A gas delivery system 120 includes gas sources 122-1, 122-2, . . . , and 122-N (collectively gas sources 122) that are connected to valves 124-1, 124-2, . . . , and 124-N (collectively valves 124) and mass flow controllers 126-1, 126-2, . . . , and 126-N (collectively MFCs 126). The MFCs 126 control flow of gases from the gas sources 122 to a manifold 128 where the gases mix. An output of the manifold 128 is supplied via an optional pressure regulator 132 to a manifold 136. An output of the manifold 136 is input to a multi-injector showerhead 140. While the manifold 128 and 136 are shown, a single manifold can be used.

The substrate support 104 includes a plurality of zones. As shown, the substrate support 104 includes an inner (central) zone 144 and an outer zone 148. A temperature of the substrate support 104 may be controlled by using one or more resistive heaters 160 arranged in the substrate support 104 as described below in more detail.

In some examples, the substrate support 104 may include coolant channels 164. Cooling fluid is supplied to the coolant channels 164 from a fluid storage 168 and a pump 170. Pressure sensors 172, 174 may be arranged in the manifold 128 or the manifold 136, respectively, to measure pressure. A valve 178 and a pump 180 may be used to evacuate reactants from the processing chamber 108 and/or to control pressure within the processing chamber 108.

A controller 182 includes a dose controller 184 that controls dosing provided by the multi-injector showerhead 140. The controller 182 also controls gas delivery from the gas delivery system 120. The controller 182 controls pressure in the processing chamber and/or evacuation of reactants using the valve 178 and the pump 180. The controller 182 controls the temperature of the substrate support 104 and the substrate 112 based upon temperature feedback (e.g., from sensors (not shown) in the substrate support and/or sensors (not shown) measuring coolant temperature).

Figure 2A:
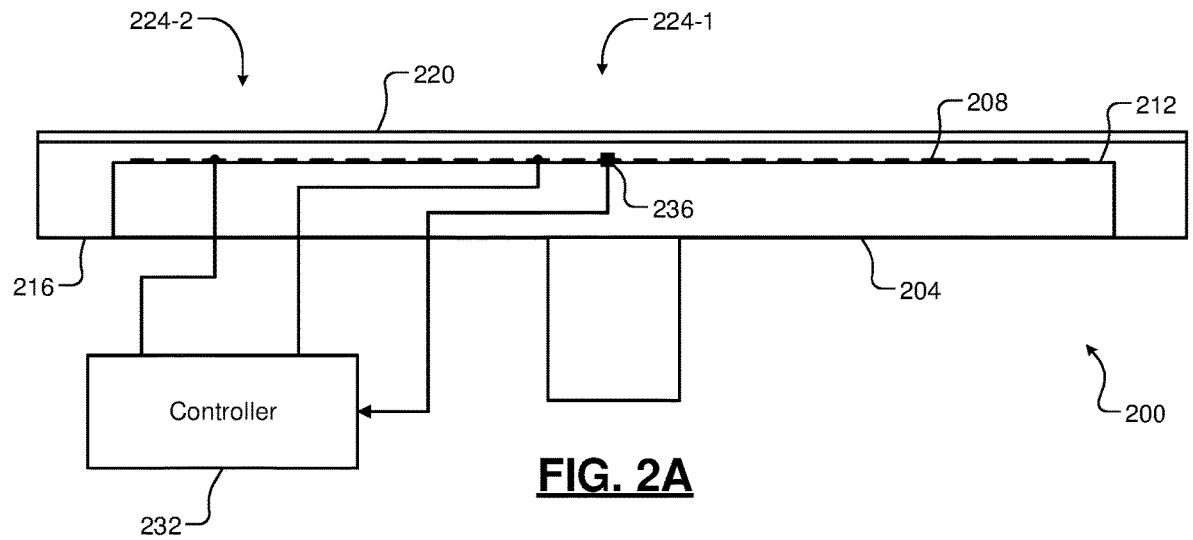
FIG. 2A is an example substrate support according to the present disclosure.
Figure 2B:
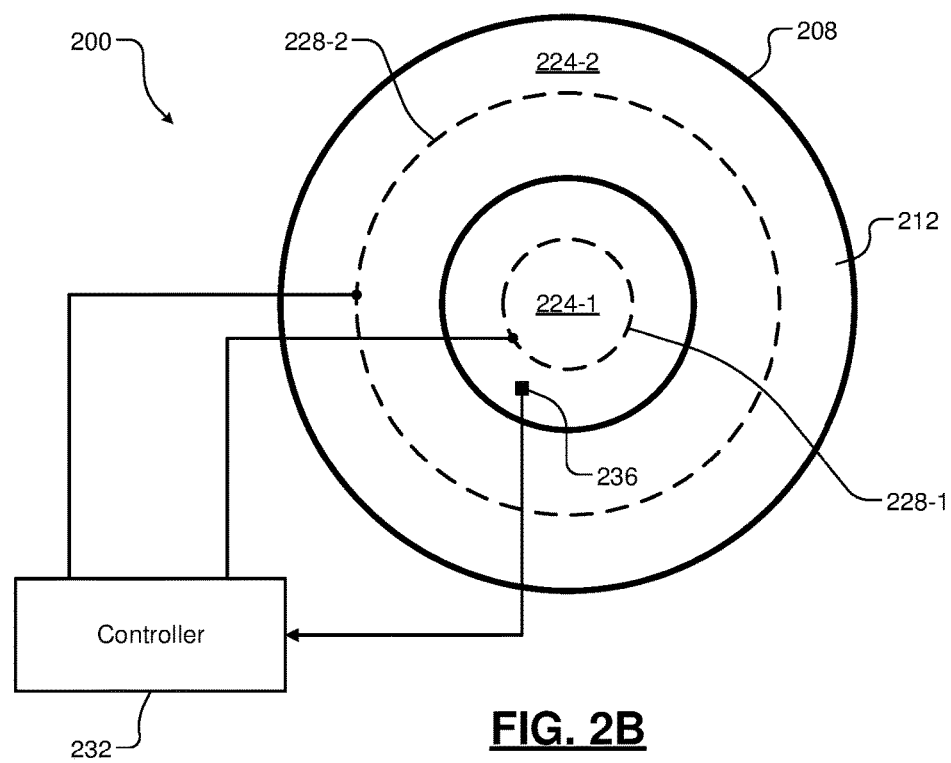
FIG. 2B is a plan view of an example heater layer of a substrate support according to the present disclosure.

Referring now to FIGS. 2A and 2B, a simplified substrate support 200 according to the present disclosure is shown schematically and in a plan view, respectively. The substrate support 200 includes a conductive baseplate 204 and a heater layer 208. For example, the heater layer 208 may be formed on an upper surface 212 of the baseplate 204. The baseplate 204 is arranged within an upper plate (e.g., an aluminum diffuser plate) 216. Accordingly, the heater layer 208 is embedded within the substrate support 200. A substrate 220 may be arranged on the substrate support 200 for processing (e.g., for ALD processing).

As shown, the substrate support 200 (and, accordingly, the heater layer 208) includes two zones: an inner, central zone 224-1 and an outer zone 224-2, referred to collectively as zones 224. The inner zone 224-1 and the outer zone 224-2 include respective resistive heater elements 228-1 and 228-2, referred to collectively as heater elements 228. For example only, the heater elements 228 are comprised of a material having a positive or negative TCR greater than 1.0%, such as molybdenum, nickel, tungsten, etc. The heater elements 228-1 and 228-2 may be separately controllable. For example, the heater elements 228 may receive power (e.g., current) in response to commands from a controller 232, which may correspond to the controller 182 of FIG. 1. In other examples, the substrate support 200 may correspond to only a single controllable zone and heater element. The substrate support 200 may include a centrally-located (i.e., in the inner zone 224-1) temperature sensor 236. The controller 232 is configured to calculate resistances of the heater elements 228-1 and 228-2 based on measured current and voltages associated with the heater elements 228-1 and 228-2 and calculate and control respective temperatures in the zones 224-1 and 224-2 based on the calculated resistances as described below in more detail.

Figure 3:
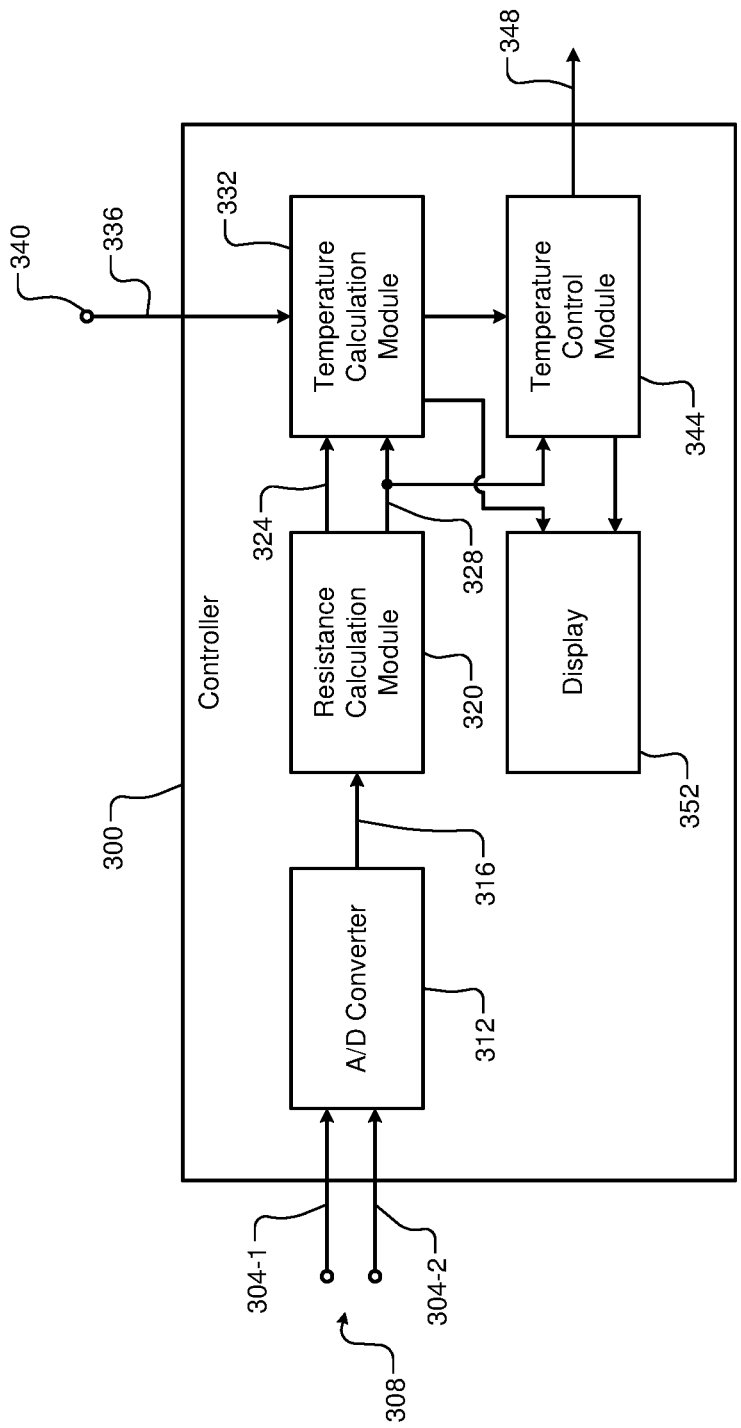
FIG. 3 is a functional block diagram of an example controller according to the present disclosure.

Referring now to FIG. 3, an example controller 300 configured to calculate and control temperatures in the zones 224-1 and 224-2 is shown. The controller 300 receives signals including, but not limited to, voltage signals 304-1 and current signals 304-2, referred to collectively as signals 304). The voltage signals 304-1 may include signals indicating respective voltages of the heater elements 228 of the zones 224. The current signals 304-2 may include signals indicating respective currents through the heater elements 228. For example, the voltage signals 304-1 and the current signals 304-2 may correspond to analog measurement signals provided from respective sensors 308.

An analog-to-digital (A/D) converter 312 converts the voltage signals 304-1 and the current signals 304-2 to digital signals 316. Although shown as a single A/D converter 312, the controller 300 may implement a different A/D converter for each of the signals 304. A resistance calculation module 320 is configured to calculate a resistance of each of the heater elements 228 based on the digital signals 316. For example, the resistance calculation module 320 may calculate the resistances based on the indicated voltages and currents in accordance with Ohm's law and output signals 324 indicating the calculated resistances. In some examples, the resistance calculation module 320 may correct for gain and/or apply an offset to the digital signals 316 prior to calculating the resistances. In some examples, the resistance calculation module 320 may calculate a power output of each of the heater elements 228 based on the indicated voltages and currents (e.g., by multiplying voltage and current for each of the heater elements 228) and output signals 328 indicating the calculated power values.

A temperature calculation module 332 according to the present disclosure receives the calculated resistances for each of the heater elements 228 and calculates a temperature in the respective zones 224-1 and 224-2 based on the calculated resistances. For example, as described above, the material of the heater elements 228 has a known TCR, which is indicative of resistance changes in response to temperature changes. Accordingly, for a given heater element 228 and material, the temperature calculation module 332 is configured to calculate changes in temperature of the corresponding zone 224 based on changes in resistance.

For example, a temperature of a zone 224 may be correlated to a resistance of the heater element 228 according to a curve/slope defined by $T=TCR*R-T_C$ (Equation 1), where T is the temperature of the zone 224, R is the calculated resistance of the heater element 228, TCR is a TCR modifier (e.g., ° C./Ohm), and $T_C$ is a temperature constant offset (e.g., 230° C.). For example, for molybdenum, the temperature of a heater element may be calculated according to $T=(46°\ C./Ohm)*R-230°\ C$. The temperature calculation module 332 stores data indicating the correlation between the temperatures of the zones 224 and the resistances of the heater elements 228. In one example, the temperature calculation module 232 stores a resistance to temperature (R/T) conversion table that indexes a range of possible measured resistances of the heater elements 228 to corresponding temperatures (e.g., in 1° C. intervals) of the zones 224 in accordance with the curve defined by Equation 1. In other examples, the temperature calculation module 224 may store and execute a model, a formula, etc. to calculate the temperatures of the zones 224 based on the calculated resistances. The temperature calculation module 332 outputs respective temperatures of the zones 224-1 and 224-2 based on the calculated resistances and the R/T conversion table.

The temperature calculation module 332 may generate the R/T conversion table during an initial calibration (e.g., during manufacture, assembly, servicing, etc. of the processing chamber 108, during installation and/or servicing of the substrate support 200, etc.). For example, during calibration, resistances of the heater elements 228 may be calculated while measuring temperatures in the zones 224 with one or more temporary temperature sensors (e.g., sensors of a temperature sensing test substrate arranged on the substrate support 200).

The temperature calculation module 332 may be further configured to apply a variable correction factor to the R/T conversion table. For example, the correction factor may shift the curve of the R/T conversion upward or downward. In other words, the correction factor may add an offset to or subtract an offset from the calculated temperature. In other examples, the correction factor may correspond to a multiplier that modifies the calculated temperature. For example, the correction factor may correspond to a gain adjustment or other parameter to compensate for structural or system variations. In other words, although the R/T conversion table or other data stored by the temperature calculation module 332 may represent a consistent relationship between the resistance and temperature of the heater elements 228, the relationship between the resistance and temperature of the respective zones 224 may vary slightly due to system variations (e.g., wiring modifications, wear and/or erosion of components, etc.). In an example where the R/T conversion table corresponds to T=TCR*R−$T_C$ as defined above in Equation 1, the temperature calculation module 332 may output a corrected temperature $T_{COR}$ according to $T_{COR}$=T+CF or $T_{COR}$=CF*T, where CF is the correction factor.

The correction factor may be determined during a startup mode that may be implemented each time power is initially provided to the substrate support (e.g., prior to processing of a substrate, when the substrate support 200 is at a room or other baseline temperature without being heated, etc.). In one example, during the startup mode, the temperature calculation module 332 may calculate the temperature in accordance with the signals 304 and the signals 324 as described above and compare the calculated temperature with a sensed temperature signal 336 received from a temperature sensor 340 (e.g., such as the temperature 236 described in FIGS. 2A and 2B). In other words, the temperature calculation module 332 may be configured to determine a difference between an actual sensed temperature and the calculated temperatures to determine the correction factor.

The temperature calculation module 332 may be configured to compare the calculated and sensed temperatures a single time (e.g., at an initial baseline temperature), at periodic intervals while power is provided to the heater elements 228 over a predetermined period and the temperature of the zones 224 increase, while power is provided to the heater elements 228 non-continuously (e.g., while the power is alternately turned on and off), while power is provided to heat only one of the heater elements 228, while the zones 224 are allowed to cool (i.e., subsequent to power being turned off), etc., and/or combinations thereof. In this manner, the correction factor may be calculated to accurately reflect a difference between the calculated temperatures of the heater elements 228 and the actual temperatures of the zones 224 and the R/T conversion table may be updated accordingly.

A temperature control module 344 receives a signal 344 indicating the calculated temperatures and controls the heater elements 228 accordingly. For example, the temperature control module 344 is configured to output power control signals 348 to adjust power (e.g., current) provided to the heater elements 228 based on the calculated temperatures. In this manner, the controller 300 is configured to implement closed-loop control of the temperatures of the zones 224. The temperature control module 344 may be further configured to receive the output signals 328 indicating the calculated power values and compare the calculated power values to commanded power indicated by the power control signals 348. In some examples, a difference between commanded and calculated power may be indicative of one or more faults, including, but not limited to, a wiring fault (e.g., disconnected or reversed wiring, a wiring short, etc.). The controller 300 may be configured to indicate the fault to a user (e.g., via a user interface/display 352 of the controller 300).

Similarly, the temperature calculation module 332 may be configured to determine and/or indicate a fault associated with a difference between the calculated temperatures and sensed temperatures (e.g., from the temperature sensor 340), a difference between respective calculated temperatures of the zones 224 (e.g., a difference greater than a predetermined threshold), a difference between the calculated temperatures and desired temperatures (e.g., as controlled via the signals 348), etc. For example, these differences may be further indicative of wiring or other faults, such as damaged components of the substrate support 200.

Figure 4:
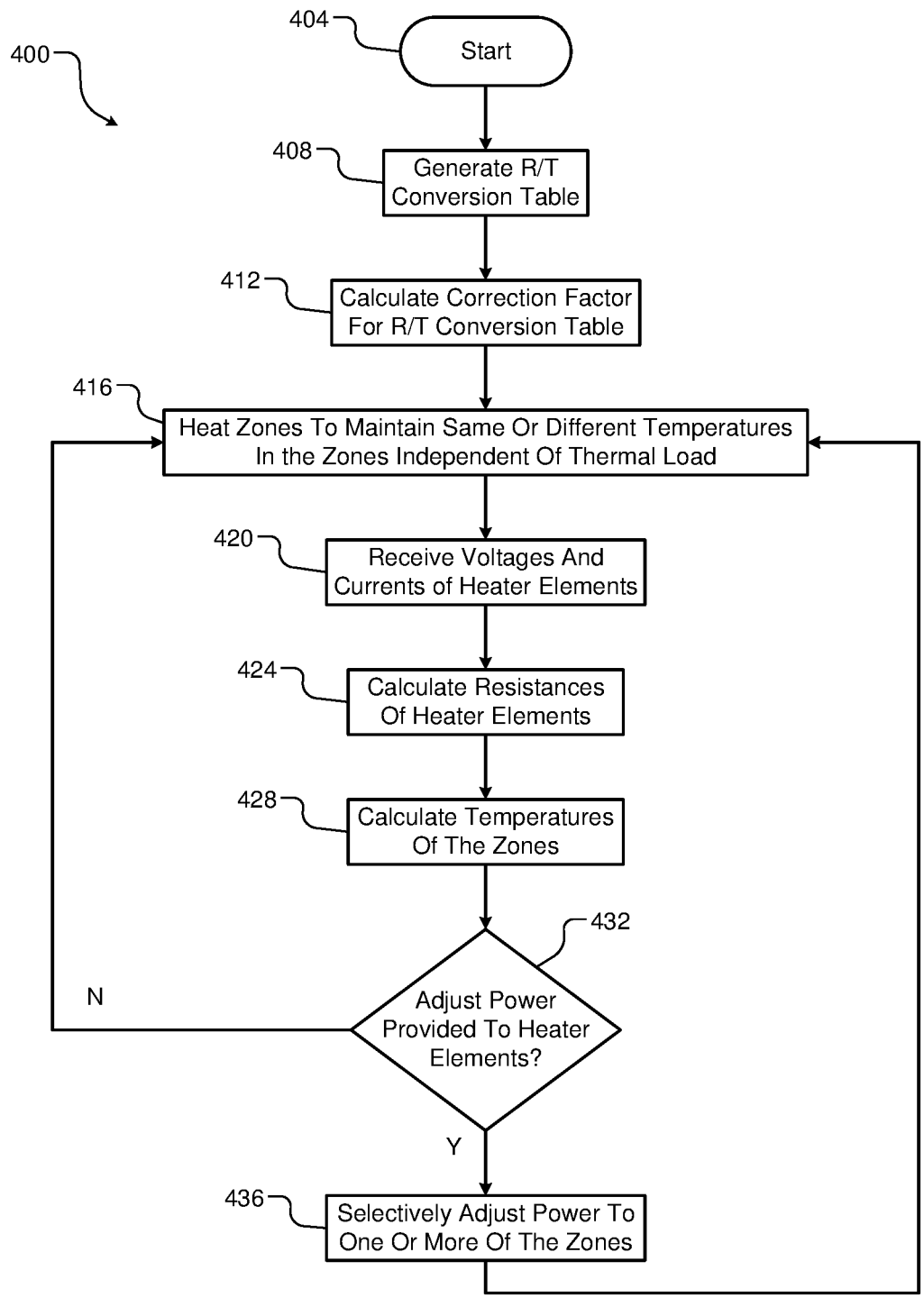
FIG. 4 illustrates an example method for calculating and controlling temperatures in different zones of a substrate support according to the present disclosure.

Referring now to FIG. 4, an example method 400 for calculating and controlling temperatures in different zones of a substrate support according to the present disclosure begins at 404. As described below, the method 400 may be implemented to control temperatures of the zones such that the temperatures in different zones are uniform (i.e., the respective zones are maintained at a same temperature) and/or non-uniform (i.e., the respective zones are intentionally maintained at different temperatures) independent of thermal load and/or other transients within the substrate processing system. For example, other transients that may affect substrate and substrate support temperatures include, but are not limited to, movement of the substrate support (e.g., movement of the edge ring), activation, deactivation, and/or adjustment of gas flows, RF power, etc. The temperature control implemented by the method 400 compensates for changes in the thermal load and/or other transients to achieve respective desired temperatures in the different zones as described below in more detail.

For example, the method 400 may control the respective temperatures of the zones based on a same or different temperature setpoints. When the temperature setpoints are different, the temperatures of the zones may be controlled to maintain a predetermined desired relationship (e.g., a predetermined difference) between the temperatures of the zones. The setpoints may vary during the processing of a given substrate.

At 408, the method 400 generates data (e.g., an R/T conversion table) indicating a correlation between the temperatures of the zones 224 and the resistances of the heater elements 228. For example, the R/T conversion table is generated in accordance with a TCR of the material comprising the heater elements 228 during a calibration process as described above in FIG. 3. At 412, the method 400 determines a correction factor to apply to the R/T conversion table. For example, the correction factor may be determined by comparing sensed temperatures to calculated temperatures during a startup mode as described above in FIG. 3. In some examples, the correction factor may be different for the respective zones 224. For example, during the calibration process, different correction factors may be calculated for each of the respective zones 224.

At 416, the method 400 (e.g., the temperature control module 344) provides power to the heater elements 228 to independently control respective temperatures of the zones 224 in accordance with respective setpoints. For example, the temperatures of the zones 224 are controlled according to desired temperatures during a process performed on a substrate, such as an ALD process. At 420, the method 400 (e.g., the A/D converter 312) receives analog signals corresponding to measured voltages and currents of the heater elements 228 and outputs digital signals indicating the measured voltages and currents. At 424, the method 400 (e.g., the resistance calculation module 320) calculates resistances of the heater elements 228 based on the measured voltages and currents. In some examples, the resistance calculation module 320 may optionally calculate power based on the measured voltages and currents.

The desired temperatures for the zones 224 may be the same or different as described above. Accordingly, the temperature control module 344 provides power to the heater elements 228 to selectively maintain the zones 224 at a same temperature and/or at different temperatures in accordance with the respective setpoints. Accordingly, as the thermal load varies during processing of the substrate, a desired relationship between the temperatures of the zones 224 (i.e., a same or different temperatures in accordance with the setpoints) is maintained regardless of changes in the thermal load.

At 428, the method 400 (e.g., the temperature calculation module 332) calculates respective temperatures in the zones 224 based on the calculated resistances. For example, the temperature calculation module 332 calculates the temperatures using the calculated resistances, the R/T conversion table correlating various resistances of the heater elements 228 to respective temperatures, and the correction factor as applied to the R/T conversion table as described above in FIG. 3.

At 432, the method 400 (e.g., the temperature control module 344) determines whether to adjust the temperatures of the zones 224 based on the calculated temperatures. For example, the temperature control module 344 may determine whether to adjust a power provided to the heater elements 228 based on a comparison (e.g., a difference) between the calculated temperatures and desired temperatures of the zones 224, the respective temperature setpoints of the zones 224, and/or the desired relationship between the zones 224 (i.e., whether the temperatures of the zones 224 are to be maintained at a same temperature, different temperatures, in accordance with a predetermined temperature offset between the zones 224, etc.). If true, the method 400 continues to 436. If false, the method 400 continues to 416. At 436, the method 400 (e.g., the temperature control module 344) selectively adjusts the power provided to the heater elements 228. For example, the method 400 may adjust the power to the heater elements 228 of only one of the zones 224 or two or more of the zones 224. In other words, the power provided to the heater elements 228 may be adjusted independently in each of the zones 224.

Typically, a rate adjustment of the power provided to the heater elements 228 to adjust the temperature may be limited. For example, because accurate temperatures of the zones 224 are not known and may only be estimated based on a sensor in only one of the zones 224, the rate of adjustment may be limited to prevent damage to the substrate support. Conversely, because the method 400 according to the principles of the present disclosure calculates the temperatures of each of the zones 224 as described above, the rate of adjustment may be significantly increased. For example, the rate of adjustment of the power provided to the heather elements may correspond to at least 10° C. per minute. In some examples, the rate of adjustment is between 15 and 20° C. per minute.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for controlling temperature of a substrate support in a substrate processing system, the method comprising:
   receiving a first current and a second current corresponding to a first heater element and a second heater element, respectively, of a substrate support;
   receiving a first voltage and a second voltage corresponding to the first heater element and the second heater element, respectively;
   calculating a first resistance of the first heater element based on the first voltage and the first current;
   calculating a second resistance of the second heater element based on the second voltage and the second current;
   calculating a first temperature of a first zone of the substrate support based on the first resistance and stored data correlating resistances to temperatures;
   calculating a second temperature of a second zone of the substrate support based on the second resistance and the stored data;
   selectively adjusting the stored data based on a comparison between a sensed temperature and at least one of the calculated first temperature and second temperature; and
   separately controlling power provided to the first heater element and the second heater element based on the first resistance and the second resistance, respectively, and respective relationships between (i) the first resistance and the first temperature and (ii) the second resistance and the second temperature.

2. The method of claim 1, further comprising (i) calculating a first power associated with the first heater element based on the first voltage and the first current and (ii) calculating a second power associated with the second heater element based on the second voltage and the second current.

3. The method of claim 1, wherein controlling the power based on the first resistance and the second resistance includes controlling the power provided to the first heater element and the second heater element based on the first temperature and the second temperature, respectively.

4. The method of claim 3, further comprising calculating the first temperature and the second temperature based on a thermal coefficient of resistance of a material of the first heater element and the second heater element.

5. The method of claim 4, wherein the material has a thermal coefficient of resistance of at least 1.0%.

6. The method of claim 4, wherein the stored data includes data correlating resistances of the material with respective temperatures of the material.

7. The method of claim 6, wherein the stored data includes a conversion table.

8. The method of claim 7, further comprising (i) calculating a correction factor based on differences between a plurality of measured temperatures of at least one of the first zone and the second zone and a plurality of calculated temperatures of the first zone and the second zone and (ii) modifying an output of the conversion table based on the correction factor.

9. The method of claim 3, further comprising calculating the first temperature and the second temperature during an atomic layer deposition process.

10. The method of claim 3, further comprising, in response to a change in a thermal load in the first zone causing a change in the first resistance, adjusting the power provided to the first heater element.

11. The method of claim 3, further comprising adjusting the power provided to the first heater element and the second heater element such that the first temperature and the second temperature are different.

12. The method of claim 1, further comprising, using a controller, controlling an atomic layer deposition process performed on a substrate arranged on the substrate support.

13. A method for controlling temperature of a substrate support in a substrate processing system, the method comprising:
- receiving a first current and a second current corresponding to a first heater element and a second heater element, respectively, of the substrate support;
- receiving a first voltage and a second voltage corresponding to the first heater element and the second heater element, respectively;
- calculating a first resistance of the first heater element based on the first voltage and the first current;
- calculating a second resistance of the second heater element based on the second voltage and the second current;
- calculating a first temperature of a first zone of the substrate support based on the first resistance and stored data correlating resistances to temperatures;
- calculating a second temperature of a second zone of the substrate support based on the second resistance and the stored data; and
- selectively adjusting the stored data based on a comparison between a sensed temperature and at least one of the calculated first temperature and second temperature.

* * * * *